April 24, 1951 C. MARTINEZ 2,549,833
AMPLIFIER BIAS VOLTAGE POWER SUPPLY
Filed Aug. 3, 1946
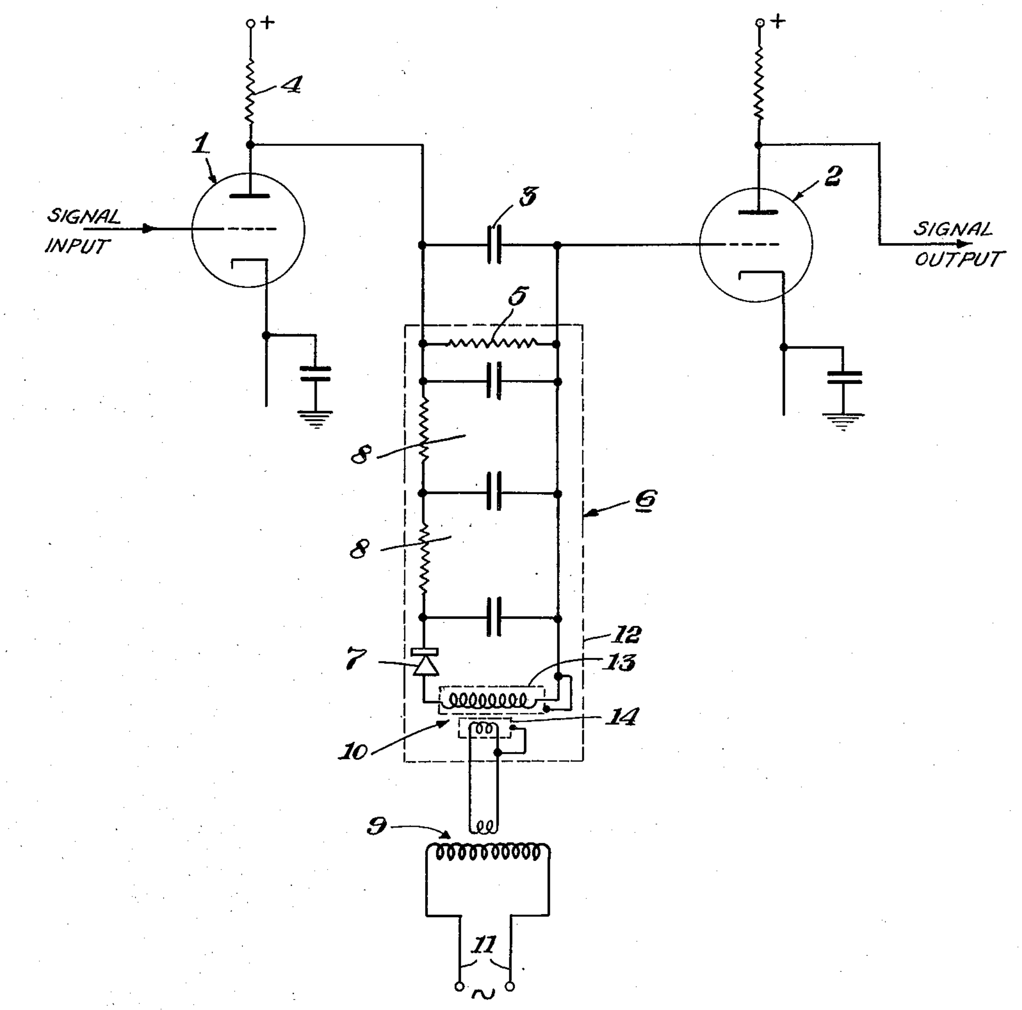
INVENTOR.
CLEMENT MARTINEZ
BY
ATTORNEY Patented Apr. 24, 1951 2,549,833

UNITED STATES PATENT OFFICE 2,549,833

AMPLIFIER BIAS VOLTAGE POWER SUPPLY

Clement Martinez, New York, N. Y., assignor, by mesne assignments, to International Standard Electric Corporation, New York, N. Y., a corporation of Delaware Application August 3, 1946, Serial No. 688,357

6 Claims. (Cl. 179—171)

My invention relates to amplifiers, particularly to amplifiers of the wide band type.

It is important in wide band amplifiers, such as video amplifiers, to obtain substantially uniform gain over the entire band. The picture-signal band of television transmitters and receivers, extending from about 60 cycles to over 4 megacycles, may be amplified with resistance-coupled amplifiers only if additional and complex circuits are used, for improving the response at the high and the low frequency ends of the band. Reduced gain of the lower frequencies, in the resistance-coupled amplifier is caused primarily by the increased impedance of the coupling condenser to the low frequencies, while reduced gain of the higher frequencies is caused by miscellaneous capacities which shunt to ground the coupling and grid-like resistances. Direct coupled amplifiers, with the anode of one stage connected directly to the control grid of the next succeeding stage, provide good response at low frequencies, including zero frequency or direct current signals, but here, also shunting capacities and reduced gain at high frequencies is encountered. Further, in direct coupled amplifiers, ungrounded and electrically isolated biasing sources for the control grids, and/or separate power supplies for the cathodes, are required. Biasing batteries in direct coupled amplifiers are impractical because of their short life, and because of their bulk and high capacity to ground.

An object of my invention is an improved wide band amplifier.

A more specific object of my invention is a wide band amplifier that is simple mechanically and electrically and that has uniform gain at both the high and low frequency ends of the band.

A further object of my invention is an improved amplifier for direct current signals.

A still further object of my invention is an improved direct current biasing source.

My improved amplifier combines the desirable features, for uniform wide-band response, of both the resistance-coupled and the direct-coupled amplifiers. A coupling condenser is connected between the output of one stage and the input of the succeeding stage, the coupling condenser being only large enough to pass the high frequencies of the band. Then across the coupling condenser is connected a resistor to pass the lowest frequencies of the band. Since this connects the anode of the one stage and grid of the succeeding stage, the anode voltage must be neutralized with respect to the grid, and the proper bias applied to the grid, by a potential source connected into the coupling circuit. According to an important feature of my invention a novel potential source, of rectified alternating current as distinguished from battery current, is so constructed and connected to the resistor as to add no shunting or grounding capacities to the coupling circuits.

The characteristic features of my invention are defined in the appended claims and a preferred embodiment is described in the following specification and shown in the accompanying drawing in which the single figure is a circuit diagram of said embodiment.

The principles of my invention may be demonstrated with but two amplifier stages and the coupling circuits therebetween. For simplicity, triodes 1 and 2 are shown, it being understood tetrodes or pentodes may be used with the usual screen grid and suppressor grid circuits. The anode of tube 1 is coupled to the grid of tube 2 through condenser 3 so that signal voltage variations appearing across coupling resistor 4 of tube 1 is impressed upon the condenser 3 and hence upon the grid of tube 2. The size of coupling condenser 3 need be only large enough to pass the high frequencies of the band. The low frequencies of the band, and direct current signals, are passed around the coupling condenser by resistor 5.

Such a coupling circuit, of course, connects the anode of tube 1 with the grid of tube 2, and to neutralize the effects of the high voltage on the grid as well as to properly bias the grid, a novel potential source 6 is connected across the coupling condenser. The potential source of my invention is energized with alternating current and may be connected to a grounded alternating current source, and yet adds negligible shunting capacities between ground and the anode-to-grid coupling circuits. The source comprises a rectifier 7 of the selenium or cuprous oxide type and several sections 8 of a resistance-capacity filter. A condenser input, and output, for the filter is shown. According to an important feature of my invention, alternating current is applied through a step-down transformer 9 to a step-up transformer 10, the transformation ratios being preferably rather high. The power source 11 may be commercial 110 volt 60 cycle energy which should be carefully regulated to prevent grid bias variations.

Although the output terminals of the filter are connected to the coupling circuits and the input terminals are connected to a grounded source, shunting capacities between the coupling circuits and ground may be kept at harmless values. First, the elements of the potential source are each small and may be enclosed in a relatively small metal container 12. The entire unit is light in weight and can be mounted on the anode and grid leads to which is it connected.

Next, the primary and secondary windings of the step-up transformer 10 are separately enclosed in sheet metal or foil cylinders 13 and 14, respectively, which are each connected as shown to one terminal of each winding. Electrostatic lines of force originating on the wires of the coupling circuits will mostly terminate at the surface of the shield can 12, and signal voltages which flow into the bias unit along the output connecting wires are largely attenuated by the filter. Those signals which do reach the secondary winding of transformer 10 are effectively isolated from the primary winding by the shields 13 and 14.

The biasing potential source 6 may be manufactured as a unit, all of the elements including the step-up transformer 10, rectifier 7, filter 8 and resistor 5, being enclosed in the shield 12. Such a unit may easily be made smaller in size and lighter in weight than the conventional dry-cell type battery, and a separate unit, energized by the common voltage source of the amplifier, mounted between each pair of stages. Since my novel biasing unit does not ground the coupling circuits, the cathode of each stage may be grounded and the heating energy taken from the common source.

Good results have been obtained in applying carefully regulated 110 volts at 11 and stepping the potential down to 2.5 volts which in transformer 10 is stepped up to the approximate plate voltage of tube 1.

The low voltage and small number of turns of primary of transformer 10 reduces the flux density in the core and improves the power factor and voltage regulation of the transformer as well as reduces the mass of the winding and size of the shield 13 and the capacity with the secondary winding.

While the compactness of my biasing unit adapts it for the direct coupled amplifier shown, it is also useful in pulse time modulation circuits and all direct current amplifiers where direct current signals as well as high frequency signals are amplified. My novel biasing source may be used to advantage in video amplifiers for television transmitters and receivers.

Amplifiers employing the principles of my invention have the advantages of both direct and resistance-capacitance interstage coupling and because of the mechanical and electrical simplicity may be manufactured on a large commercial scale.

I claim:

1. A broad band direct coupled circuit comprising at least two stages coupled through a coupling condenser, an alternating current supply, a high ratio step-down transformer connected to said supply, a high ratio step-up transformer connected to said step-down transformer having separately electrostatically shielded primary and secondary coils, a rectifier and series of filters coupled to said shielded secondary the output of which is shunted across the first-mentioned condenser and isolated from ground, whereby a steady direct current bucking voltage is provided and a resistance connected in shunt with the output from said step-down transformer for passing low frequency variations around said condenser to the next stage.

2. A broad band-direct-coupled amplifier comprising two amplifier tubes, a coupling condenser coupled between the output of one tube and the input of the other tube, a resistance connected across said condenser for passing low frequency variations around said condenser to the next stage, an alternating current supply, a high ratio step-down transformer connected to said supply, a high ratio step-up transformer connected to said step-down transformer, said step-up transformer having separately electrostatically shielded primary and secondary windings, a rectifier and series of filters coupled to the shielded secondary winding, the output of the filter being shunted across said resistance and isolated from ground, whereby a steady direct current voltage is provided for bucking the connected output voltage of said one tube, and whereby low frequency signal voltages may pass around said condenser.

3. An amplifier comprising at least two stages, a filter comprising a parallel connection of a condenser and a resistance, the output terminals of said filter being connected, respectively, to the output of one stage and the input of another stage to provide a low impedance path between said stages for low frequency signals; a high ratio step-up transformer and a rectifier serially connected in shunt with said resistance and isolated from ground, said filter, rectifier and transformer being enclosed in a unitary electrostatic shield.

4. A direct current amplifier, a first amplifier tube having an anode, a second amplifier tube having a grid, a resistor directly connected at opposite ends to said anode and to said grid; a biasing unit comprising a source of alternating current, a rectifier and a filter serially connected and enclosed in a unitary shield, the output of said unit being connected across said resistor and isolated from ground.

5. A direct current potential source comprising a high ratio step-up transformer, separate electrostatic shields enclosing, respectively, the primary winding and the secondary winding of said transformer, input terminals connected to said primary winding, a selenium rectifier connected to said secondary winding, a filter having a plurality of resistance-capacity sections connected to said rectifier, a resistor, the output of said filter being connected across said resistor and to output terminals and isolated from ground, a metal container enclosing said transformer, rectifier, filter and resistor, whereby low capacity exists between said input and output terminals.

6. An amplifier comprising a first amplifier tube having an anode, a second amplifier tube having a grid; a filter having at least one high capacity condenser across the sides of the filter, the output terminals of said filter being connected, respectively, to said anode and to said grid and isolated from ground whereby low frequency signals may pass from said anode to said grid, a rectifier connected to the input end of said filter, and an alternating current source connected to said rectifier.

CLEMENT MARTINEZ.

REFERENCES CITED

The following references are of record in the file of this patent:

UNITED STATES PATENTS

| Number | Name | Date |
|---|---|---|
| 1,751,527 | Nyquist | Mar. 25, 1930 |
| 1,973,725 | Ranger | Sept. 18, 1934 |
| 2,037,659 | Schade | Apr .14, 1936 |
| 2,275,023 | White | Mar. 3, 1942 |
| 2,324,279 | Clark | July 13, 1943 |

OTHER REFERENCES

Terman: Radio Engineers' Handbook, First Edition, 1943.